United States Patent [19]

Radu et al.

[11] 4,264,861

[45] Apr. 28, 1981

[54] ELECTRONIC AMPERE-HOUR METER

[75] Inventors: Ionel Radu; Florin T. Tanasescu, both of Bucharest, Romania

[73] Assignee: Institutul de Cercetari Pentru Industria Electrotehnica, Bucharest, Romania

[21] Appl. No.: 967,850

[22] Filed: Dec. 8, 1978

[51] Int. Cl.³ ............................................. G01R 21/06
[52] U.S. Cl. .................................... 324/142; 324/111; 324/118; 324/428
[58] Field of Search ............... 324/142, 118, 120, 111, 324/428, 427

[56] References Cited

U.S. PATENT DOCUMENTS

| | | | |
|---|---|---|---|
| 2,637,820 | 5/1953 | McCreary | 324/111 X |
| 2,663,846 | 12/1953 | Gilbert | 324/111 X |
| 2,897,445 | 7/1959 | Goodale | 324/111 |
| 2,919,408 | 12/1959 | Brown | 324/111 X |
| 2,994,825 | 8/1961 | Anderson | 324/111 X |
| 3,041,535 | 6/1962 | Cochran | 324/118 |
| 3,484,681 | 12/1969 | Grady, Jr. et al. | 324/428 |
| 3,805,157 | 4/1974 | Acks et al. | 324/428 X |
| 3,971,980 | 7/1976 | Jungfer et al. | 324/427 X |

*Primary Examiner*—Stanley T. Krawczewicz
*Attorney, Agent, or Firm*—Karl F. Ross

[57] ABSTRACT

An amp-hour meter for a load driven by direct current, such as an electric vehicle, comprises a modulator connected across a resistor in series with the load for amplitude-modulating a pulse train from a multivibrator translated by a demodulator into a unipolar voltage varying with the load current. A sampler converts this voltage into a train of output pulses, generated at a rate proportional to the voltage level, whose count is numerically displayed as a measure of current consumption. The multivibrator, the demodulator, an intervening amplifier, the sampler and the display unit are serially energized with stabilized voltage and reduced current via a supply network connected across the load, this network including a ballast lamp in series with a Zener diode.

4 Claims, 1 Drawing Figure

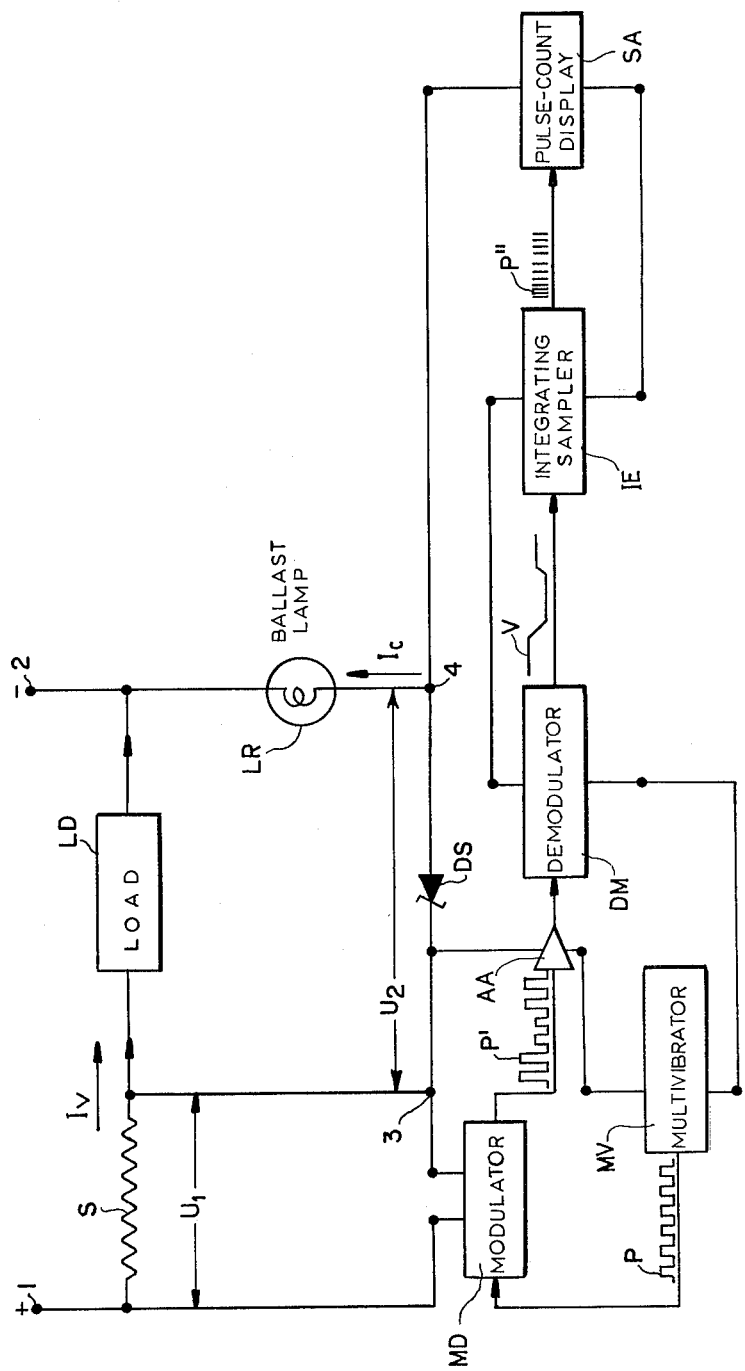

ELECTRONIC AMPERE-HOUR METER

Our present invention relates to an electronic ampere-hour meter employed on DC electric traction vehicles.

Conventional amp-hour meters using a DC motor have several disadvantages, such as difficulties in perfecting an operating process for series production, high equipment cost, sensitivity to shocks, large weight and a fixed operating position.

The object of our invention is to provide an improved electronic amp-hour meter which eliminates these disadvantages.

An ampere-hour meter according to our invention comprises a multivibrator generating a train of first pulses whose initially constant amplitude is changed, in accordance with the instantaneous magnitude of a current drawn by an associated load from a DC source, by means of a modulator in series with the multivibrator which has input terminals connected across a resistor lying in series with the load. The amplitude-modulated first pulses are converted by a demodulator into a unipolar voltage which is proportional to the voltage drop developed across the resistor and thus to the load current. A sampler connected to the demodulator derives from this unipolar voltage a series of second pulses whose rate or recurrence frequency varies with the level of the unipolar voltage, and therefore with the load current, so that the count of these second pulses is a measure of the energy consumed by the load, this count being visually indicated by a numerically operating display device connected to the sampler. The several circuit components required for this purpose, including the aforementioned multivibrator, demodulator, sampler and display device, are energized by a supply network connected across the load.

Pursuant to a more particular feature of our invention, the supply network includes a current-limiting resistance such as a ballast lamp in series with a Zener diode, the energizing inputs of the several circuit components being all connected in series with one another across that Zener diode.

The above and other features of our invention will now be described in detail with reference to the accompanying drawing the sole FIGURE of which illustrates a representative embodiment.

In the drawing we have shown an amp-hour meter for an electric traction vehicle, represented by a load LD, supplied with 750 V direct current from a source with positive and negative terminals 1, 2. The current $I_v$ consumed by the vehicle causes a voltage drop $U_1$ across a shunt resistor S, used as input signal for a modulator which modulates a pulse train P generated by a multivibrator MV. An amplitude-modulated pulse train P' obtained at the output of MD is amplified in an AC amplifier AA and then applied to a demodulator DM which converts it into a unipolar voltage V. This conversion of the DC signal represented by the voltage drop U, through a modulation - demodulation process is necessary to amplify it to the level necessary for the correct operation of the following stages. The DC signal from the output of demodulator DM is fed to a sampling integrator IE generating a series of pulses P'' whose rate varies with the level of voltage V and whose number is therefore proportional to the integral of the load current IV. Pulses P'' drive directly a display system SA indicating value of the consumed ampere-hours, corresponding to the load current $I_v$ drawn by the motor vehicle.

A ballast lamp LR and a Zener diode DS are serially connected across the load LD to constitute a supply network for circuit components MV, AA, DM, IE and SA whose energizing inputs, as shown, are all connected in series with one another across terminals 3 and 4 of Zener diode DS. The latter establishes a stabilized operating voltage $U_2$ for these circuit components while ballast lamp LR, acting as a current-limiting resistance, is traversed by a current $I_c$ of low magnitude allowing proper operation of the amp-hour meter even in the face of large variations in the line voltage appearing on terminals 1 and 2. Modulator MD, of course, is operated directly by the voltage drop $U_2$ across series resistor S.

Our improved electronic amp-hour meter exhibits the following features:

it can be realized with commonly available electronic components;

it can be produced quickly and at low cost, even for a very small series;

it can be used in an electric traction system for both vehicles and substations;

its stabilized operating voltage enables its use in a variety of fields either as a meter or as a proper current transducer on circuits under high voltage;

the numerical electric information provided by it can be used in more complex electronic installations for watching and optimizing the mode of operation thereof;

it possesses a much higher reliability than comparable conventional devices:

it can operate under conditions of shocks and vibrations with no need for special protection; and it has small weight and size.

We claim:

1. An electronic ampere-hour meter for measuring current consumption in a load powered by a source of direct current, comprising:
    a resistor connected across the source in series with the load for developing a voltage drop proportional to load current;
    a multivibrator generating a train of constant-amplitude first pulses;
    a modulator in series with said multivibrator having input terminals connected across said resistor for changing the amplitudes of said first pulses in accordance with said voltage drop;
    a demodulator connected to said modulator for converting the amplitude-modulated first pulses into a unipolar voltage proportional to said voltage drop;
    sampling means connected to said demodulator for deriving from said unipolar voltage a series of second pulses whose recurrence frequency varies with the level of said unipolar voltage;
    numerical display means connected to said sampling means for visually indicating a count of said second pulses representative of the electric energy consumed by the load; and
    a supply network for circuit components including said multivibrator, said demodulator, said sampling means and said display means, said network being connected across the load.

2. An ampere-hour meter as defined in claim 1 wherein said supply network includes a current-limiting resistance in series with a Zener diode, said components having respective pairs of energizing inputs all connected in series with one another across said Zener diode.

3. An ampere-hour meter as defined in claim 2 wherein said components further include a pulse amplifier inserted between said modulator and said demodulator.

4. An ampere-hour meter as defined in claim 2 or 3 wherein said current-limiting resistance comprises a ballast lamp.

* * * * *